(12) United States Patent
Saito

(10) Patent No.: US 7,333,342 B2
(45) Date of Patent: Feb. 19, 2008

(54) FASTENING OF A MEMBER PRESSING A HEAT SINK AGAINST A COMPONENT MOUNTED ON A CIRCUIT BOARD

(75) Inventor: Kenichi Saito, Tachikawa (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 11/699,788

(22) Filed: Jan. 30, 2007

(65) Prior Publication Data

US 2007/0178757 A1 Aug. 2, 2007

(30) Foreign Application Priority Data

Jan. 31, 2006 (JP) ............................. 2006-023888

(51) Int. Cl.
*H05K 7/20* (2006.01)

(52) U.S. Cl. ..................................... 361/719

(58) Field of Classification Search ................ 361/719, 361/704; 439/487; 165/185; 257/718, 719
See application file for complete search history.

(56) References Cited

U.S. PATENT DOCUMENTS

| | | | | |
|---|---|---|---|---|
| 5,731,952 A * | 3/1998 | Ohgami et al. | ............. | 361/687 |
| 5,786,635 A | 7/1998 | Alcoe et al. | | |
| 5,863,814 A | 1/1999 | Alcoe et al. | | |
| 6,141,214 A * | 10/2000 | Ahn | ............................ | 361/687 |
| 6,245,186 B1 | 6/2001 | Alcoe et al. | | |
| 6,255,136 B1 | 7/2001 | Alcoe et al. | | |
| 6,310,779 B1 * | 10/2001 | Wang | ............................ | 361/760 |
| 6,485,311 B2 * | 11/2002 | Torok et al. | ................... | 439/73 |
| 6,738,254 B2 * | 5/2004 | Oogami | ...................... | 361/680 |
| 6,900,990 B2 * | 5/2005 | Tomioka | ...................... | 361/752 |
| 7,095,614 B2 * | 8/2006 | Goldmann | ................... | 361/704 |
| 7,170,750 B2 * | 1/2007 | Tanaka | ......................... | 361/719 |
| 2002/0036888 A1 * | 3/2002 | Oogami | ....................... | 361/687 |
| 2005/0117307 A1 | 6/2005 | Tanaka | | |

FOREIGN PATENT DOCUMENTS

JP 9-83165 3/1997

* cited by examiner

*Primary Examiner*—Chandrika Prasad
(74) *Attorney, Agent, or Firm*—Knobbe Martens Olson & Bear LLP

(57) ABSTRACT

According to an embodiment, a circuit board device comprises a circuit board having a first surface and a second surface opposed thereto, a first electronic component mounted on the first surface of the circuit board, a stud set up on the first surface of the circuit board and fastened to the circuit board by a stud fixing screw threaded therein from the second surface side, a heat radiating member which is thermally connected to the first electronic component and radiates heat from the first electronic component, and a pressing member which is screwed to the stud from the first surface side of the circuit board and presses the heat radiating member against the first electronic component. A second electronic component is located on the second surface of the circuit board so as to overlap the stud fixing screw.

5 Claims, 4 Drawing Sheets

FASTENING OF A MEMBER PRESSING A HEAT SINK AGAINST A COMPONENT MOUNTED ON A CIRCUIT BOARD

CROSS-REFERENCE TO RELATED APPLICATIONS

This application is based upon and claims the benefit of priority from Japanese Patent Application No. 2006-023888, filed Jan. 31, 2006, the entire contents of which are incorporated herein by reference.

BACKGROUND

1. Field

One embodiment of the invention relates to a circuit board device provided with a radiator plate for cooling an electronic component and an electronic apparatus provided with the same.

2. Description of the Related Art

In recent years, there have been spread small-sized portable computers, called notebook personal computers or mobile computers. For higher portability, the main bodies of the computers of this type are being made smaller and smaller. At the same time, these computers are expected to have further improved performance and enhanced multifunctional properties.

In general, one such computer comprises a substantially rectangular flat main body and a display unit that is swingably attached to the body. The body contains a printed circuit board, on which a large number of electronic components are mounted, and a hard disc drive, an optical disc drive, etc. for use as information storage devices. In order to reduce the size of the computer, these components are arranged with high packing density in the computer body. Among electronic components that are provided in the body, moreover, a CPU and an IC chip are progressively enhanced in performance and generate much heat.

Accordingly, the computer of this type is provided with a cooling unit for cooling the interior of its body, e.g., the CPU. The cooling unit comprises a heat radiating member, such as a radiator plate or a heat sink duct formed of aluminum or some other highly heat-radiating metal. The heat radiating member is in contact with the CPU when it is mounted on the printed circuit board. The CPU is cooled in a manner such that heat transferred from the CPU to the heat radiating member is radiated into the computer body. The heat radiating member is elastically pressed against the CPU to cool the CPU securely.

The heat radiating member, as described in Jpn. Pat. Appln. KOKAI Publication No. 9-83165, for example, is usually mounted on the printed circuit board by being screwed to a stud on the board. The CPU, a heat generator, is mounted on one surface of the circuit board, and the heat radiating member is located on the same surface side of the board so as to overlap the CPU. The stud is tacked on the other surface of the printed circuit board by soldering. The heat radiating member is threadedly fixed by threading a fixing screw into the stud through the radiating member and the circuit board from the surface side of the circuit board.

As described above, however, the CPU and the heat radiating member are mounted on the one surface side of the printed circuit board with the stud projecting from the other surface of the board. In this state, the stud prevents other electronic components from being easily located and mounted in that region of the other surface of the circuit board on which the stud is set up. Thus, it is difficult to effectively utilize a space over the circuit board, which constitutes a hindrance to improvement of the packing density and reduction of the computer size.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, a circuit board device comprises: a circuit board having a first surface and a second surface opposed thereto; a first electronic component mounted on the first surface of the circuit board; a stud set up on the first surface of the circuit board and fastened to the circuit board by a stud fixing screw threaded therein from the second surface side; a heat radiating member which is thermally connected to the first electronic component and radiates heat from the first electronic component; a pressing member which is screwed to the stud from the first surface side of the circuit board and presses the heat radiating member against the first electronic component; and a second electronic component located on the second surface of the circuit board so as to overlap the stud fixing screw.

A portable computer according to an embodiment of this invention will now be described in detail with reference to the accompanying drawings.

Figure 1:
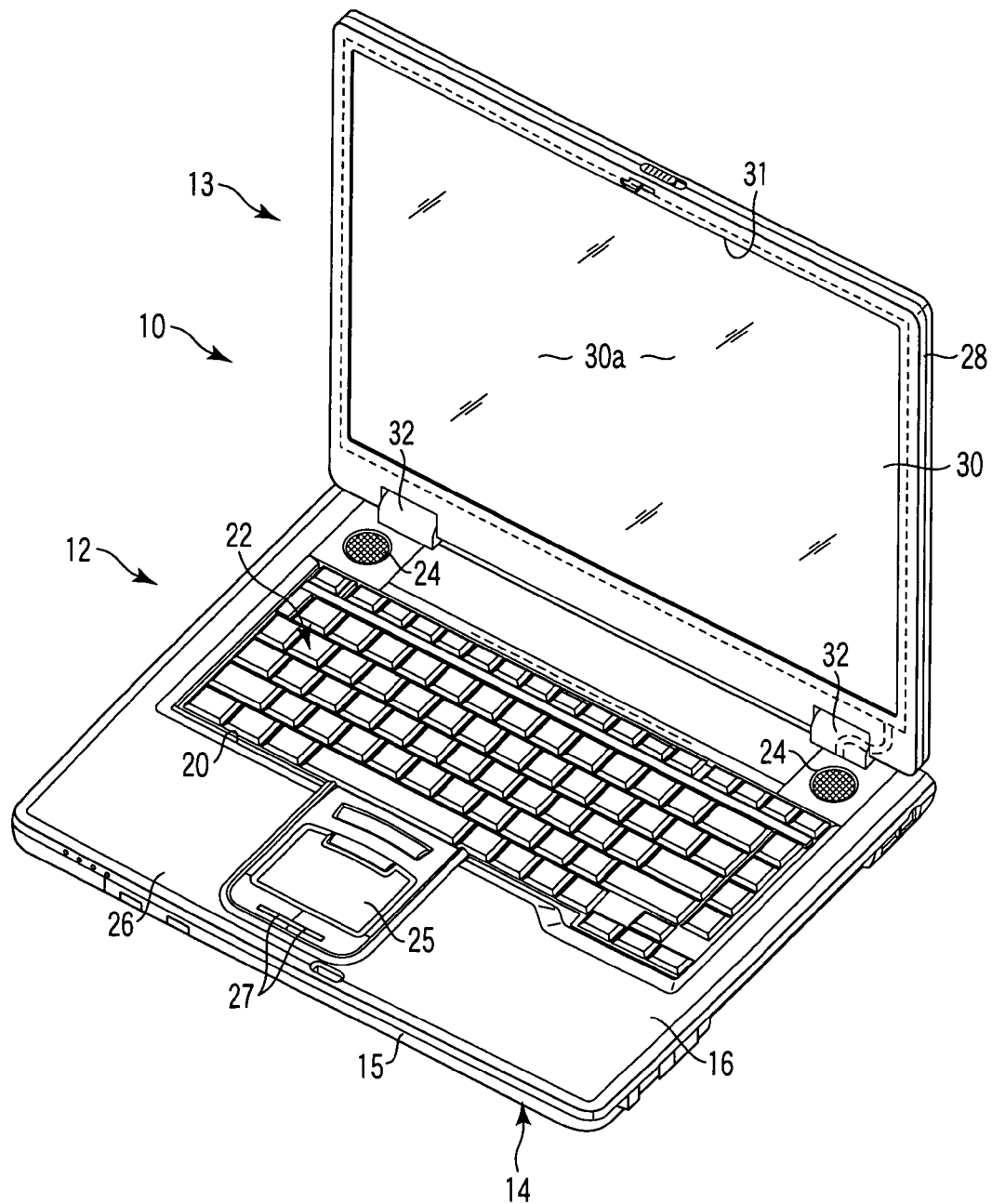
FIG. 1 is an exemplary perspective view of a portable computer according to an embodiment of the invention.

As shown in FIG. 1, a portable computer 10 as an electronic apparatus comprises a main body 12 in the form of a flat rectangular box and a flat rectangular display unit 13. The computer body 12 is provided with a case 14 made of, e.g., synthetic resin. The case 14 has an open-topped rectangular base portion 15 and a top cover 16 joined to the base portion so as to cover its opening.

Figure 2:
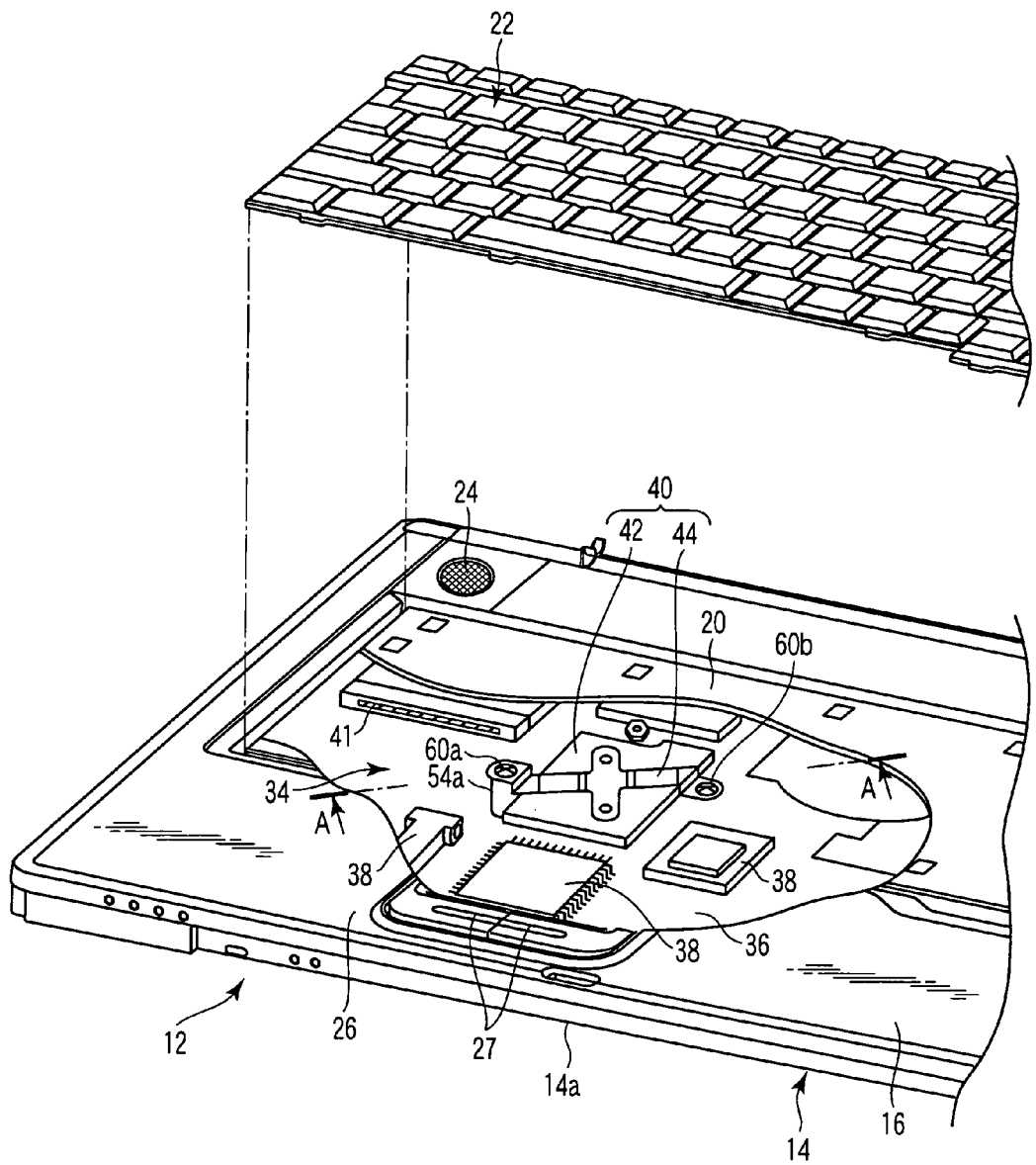
FIG. 2 is an exemplary cutaway exploded perspective view of a main body of the portable computer.

As shown in FIGS. 1 and 2, the base portion 15 of the case 14 integrally has a rectangular bottom wall 14a, left- and right-hand side walls set up around the bottom wall, a front wall, and a rear wall. The top cover 16 is opposed to the bottom wall 14a and forms a top wall of the case 14. In the case 14, a keyboard mounting portion 20 is provided in the central part of the top cover 16, and a keyboard 22 is placed on the keyboard mounting portion. Speakers 24 are exposed individually on the left- and right-hand sides of the rear end portion of the top cover 16. The front end portion of the upper surface of the top cover 16 constitutes a palm rest area 26, and a touch pad 25 and a click button 27 are arranged substantially in the center of the palm rest area.

As shown in FIG. 1, the display unit 13 comprises a housing 28 in the form of a flat rectangular box and a liquid crystal display panel 30. A display screen 30a of the display panel 30 is exposed to the outside through a display window 31 in the housing 28. The housing 28 has a pair of leg portions 32 protruding from its one end portion. The leg portions 32 are rockably supported on the rear end portion of the case 14 by a hinge portion (not shown). Thus, the display unit 13 is rockable between a closed position in which is brought down to cover the keyboard 22 from above and an open position in which it stands behind the keyboard 22.

Figure 3:
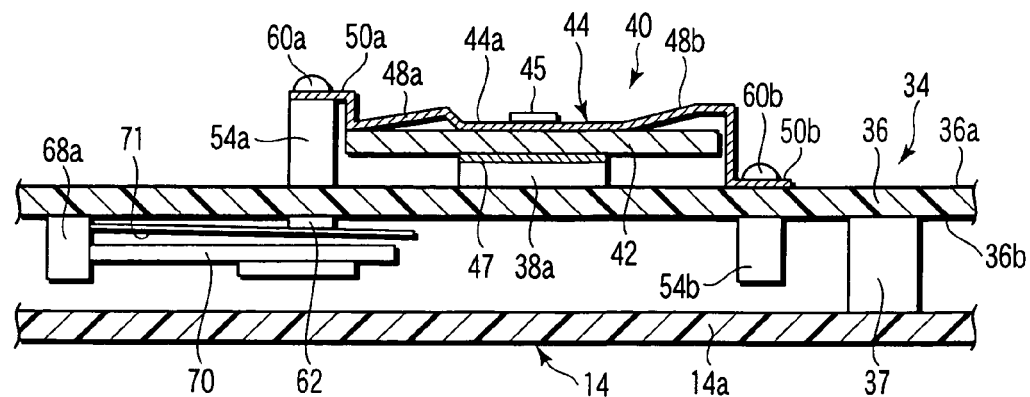
FIG. 3 is an exemplary sectional view of the internal structure of the computer body taken along line A-A of FIG. 2.
Figure 4:
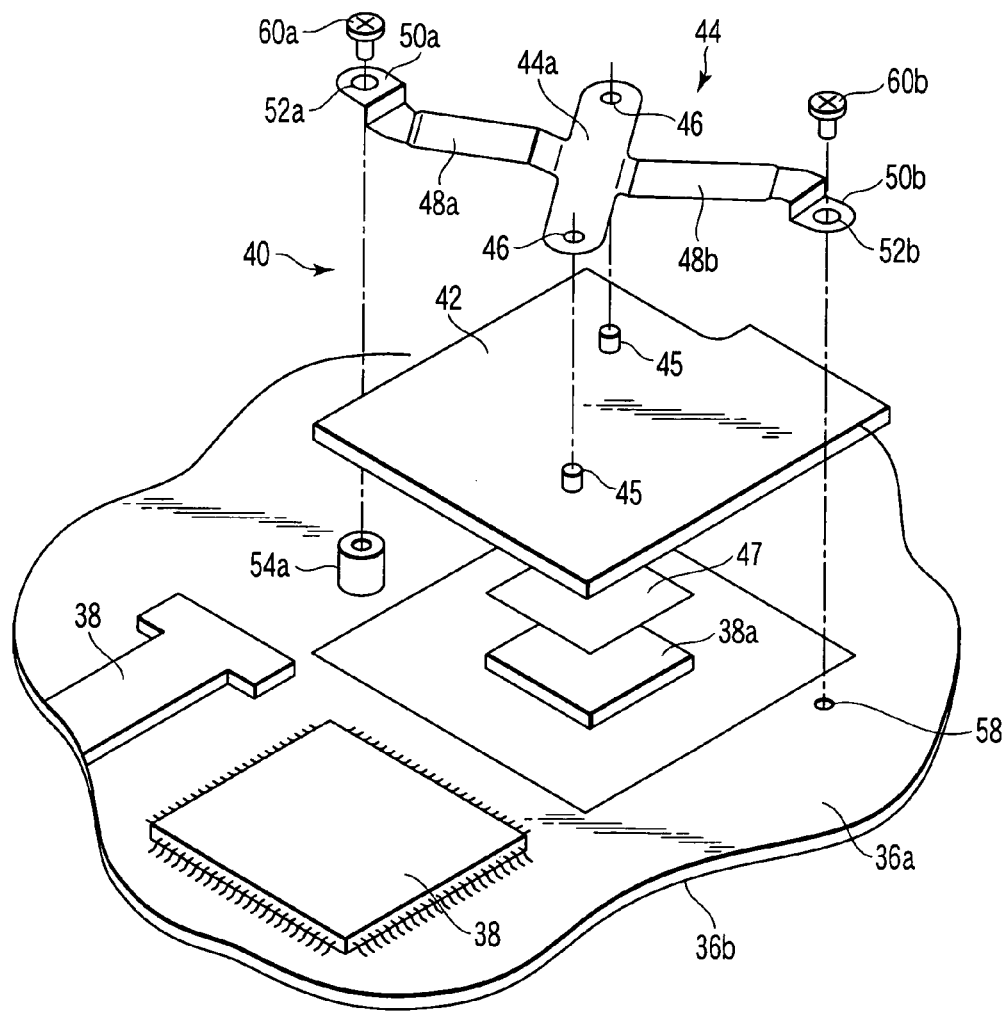
FIG. 4 is an exemplary exploded perspective view showing a cooling section of a circuit board device provided in the computer body.

The computer body 12 contains an optical disc drive (not shown), hard disc drive (HDD), card slot, battery pack, and various other electronic components. As shown in FIGS. 2 to 4, moreover, a circuit board device 34 is located on the bottom wall 14a in the case 14. The board device 34 is electrically connected to the keyboard 22, liquid crystal display panel 30, and drives and other electronic components in the case 14.

The circuit board device 34 comprises a printed circuit board 36 located on the bottom wall 14a. The circuit board 36 has a first surface 36a situated on the top cover side and a second surface 36b opposed to the bottom wall 14a on the side opposite from the first surface. As shown in FIG. 3, the printed circuit board 36 is located on a boss 37 that is formed on the inner surface of the bottom wall 14a of the case 14. As shown in FIGS. 2 to 4, semiconductor devices 38, including an MPU 38a for use as a heat generating component, and electronic components including a connector 41 and the like are mounted on the first surface 36a of the circuit board 36. Electronic components are also mounted on the second surface 36b, as described later.

The MPU 38a that functions as a first electronic component generates heat as it is actuated. Therefore, a cooling section 40 for cooling the MPU 38a is provided on the first surface side of the printed circuit board 36. The cooling section 40 has a radiator plate 42, which serves as a heat radiating member for radiating heat from the MPU 38a, and a fixing plate 44 that presses the radiator plate against the MPU 38a.

The radiator plate 42 is a substantially rectangular structure that is formed of a metal with high thermal conductivity, such as aluminum. The radiator plate 42 has an area larger enough than the plane area of the MPU 38a. The radiator plate 42 is located overlapping the MPU 38a and extends substantially parallel to the first surface 36a of the printed circuit board 36. Further, the radiator plate 42 is in surface contact with the upper surface of the MPU 38a with a heat conducting sheet 47 therebetween and is thermally connected to MPU. Two fixing pins 45 protrude from the central part of the upper surface of the radiator plate 42.

The fixing plate 44 for use as a pressing member is formed of a metal plate of, for example, stainless steel. It has a pressing portion 44a that engages the central part of the upper surface of the radiator plate 42 and a pair of arm portions 48a and 48b that extend individually on the opposite sides from the pressing portion 44a. The pressing portion 44a has a pair of through holes 46 through which the fixing pins 45 of the radiator plate 42 are passed. It is fixed on the upper surface of the radiator plate by staking the respective distal end portions of the fixing pins.

The arm portions 48a and 48b extend diagonally upward from the pressing portion 44a. Substantially L-shaped mounting portions 50a and 50b are formed integrally on their respective extended ends. Mounting holes 52a and 52b are formed in the mounting portions 50a and 50b, respectively.

The mounting portions 50a and 50b of the fixing plate 44 are screwed to studs 54a and 54b, respectively, on the printed circuit board 36. The stud 54a is tacked on the first surface 36a of the printed circuit board 36 by soldering and set substantially upright on the first surface. Further, the stud 54a is fastened to the circuit board 36 by a stud fixing screw 62 that is threaded into the stud 54a through the circuit board from its second surface side. The mounting portion 50a of the fixing plate 44 is fastened to the stud 54a from the first surface side of the circuit board 36 by a setscrew 60a that is threaded into the stud 54a through the mounting hole 52a.

The other stud 54b is tacked on the second surface 36b of the printed circuit board 36 by soldering and set substantially upright on the second surface. The mounting portion 50b of the fixing plate 44 is fastened to the circuit board 36 and the stud 54b from the first surface side of the circuit board 36 by a setscrew 60b that is threaded into the stud 54b through the mounting hole 52b and a through hole 58 in the circuit board 36.

Thus, the mounting portions 50a and 50b of the fixing plate 44 that are situated individually on the opposite sides of the radiator plate 42 are fixed to the printed circuit board 36. The fixing plate 44 presses the pressing portion 44a against the radiator plate 42 by means of the elastic force of the arm portions 48a and 48b and brings the radiator plate 42 into close contact with the MPU 38a with the heat conducting sheet 47 between them. Thus, the radiator plate 42 receives heat from the MPU 38a and radiates it into the case 14, thereby compulsorily cooling the MPU 38a.

As shown in FIGS. 2 and 3, the fixing plate 44 extends diagonally at an angle to a pair of opposite side edges of the radiator plate 42. Thus, it enables the radiator plate 42 to be firmly fixed without looseness.

Figure 5:
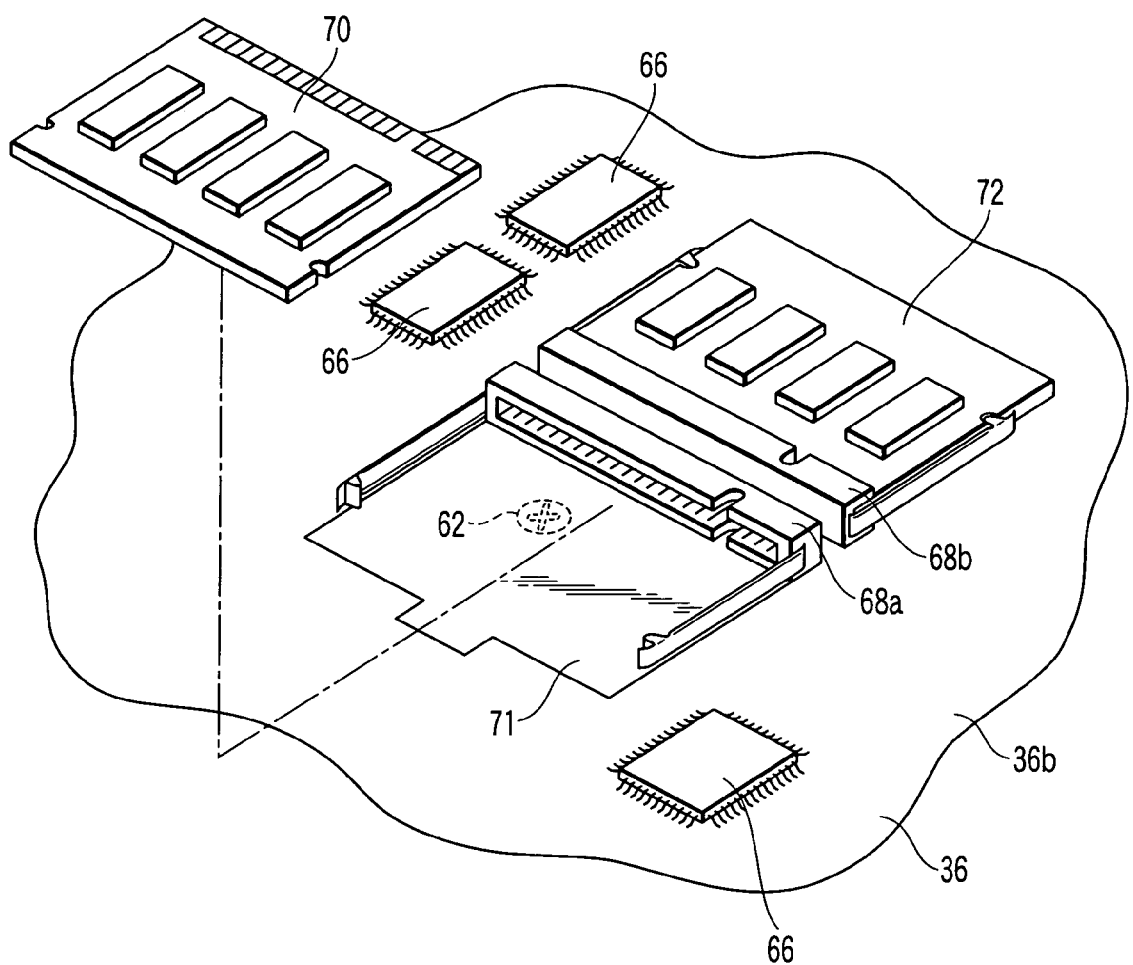
FIG. 5 is an exemplary exploded perspective view showing a mounting structure on the reverse side of the circuit board device.

As shown in FIGS. 4 and 5, on the other hand, a plurality of electronic components, including semiconductor devices 66 and connectors 68a and 68b, are mounted on the first surface 36a of the printed circuit board 36. The connector 68a is connected with a memory board 70 for use as a second electronic component, which adjacently faces the second surface 36b and is located overlapping the stud fixing screw 62. A dielectric sheet 71 is provided between the memory board 70 and the second surface 36b of the printed circuit board 36. Further, the connector 68b is connected with a video board 72, which adjacently faces the second surface 36b of the circuit board 36.

According to the circuit board device 34 and the portable computer 10 constructed in this manner, the MPU 38a as a heat generating component and the cooling section 40 for cooling it are mounted on the first surface 36a of the printed circuit board 36. The stud 54a on which the cooling section 40 is fixed is set up on the first surface 36a of the circuit board 36 and fixed to the circuit board by the stud fixing screw 62 that is threaded into the stud 54a from the side of the second surface 36b. Therefore, the stud 54a never projects on the side of the second surface 36b of the circuit board 36, so that some other electronic components can be also mounted and arranged on that part of the second surface which overlaps the stud 54a. Thus, a space over the printed circuit board 36 can be utilized effectively, so that the packing density can be improved, and the board device and the computer can be reduced in size and thickness.

In mounting the radiator plate 42, moreover, the stud 54a that is set up on the first surface 36a of the printed circuit board 36 can be securely prevented from falling off by being fixed from the side of the second surface 36b with the stud fixing screw 62. Furthermore, the two setscrews 60a and 60b for fixing the fixing plate 44 can be threaded into the studs from the same surface side of the circuit board 36, so that the working efficiency of assembly can be prevented from lowering.

The present invention is not limited directly to the embodiment described above, and its components may be embodied in modified forms without departing from the scope or spirit of the invention. Further, various inventions may be made by suitably combining a plurality of components described in connection with the foregoing embodiment. For example, some of the components according to the foregoing embodiment may be omitted. Furthermore, components according to different embodiments may be combined as required.

For example, the shapes and materials of the radiator plate and the fixing plate are not limited to the foregoing embodiment but may be variously modified as required. The radiator plate and the fixing plate may be formed integrally with each other. The heat radiating member is not limited to a flat radiator plate but may be a heat sink or a structure that is provided with a plurality of fins. The first electronic component that is cooled by the cooling section is not limited to an MPU but may be any other electronic component, such as a graphic chip. The second electronic component is not limited to a memory board but may be any other electronic component, such as a graphic board, TV tuner board, or modem substrate.

This invention is not limited to the application to the portable computer but is also applicable to any other electronic apparatus, such as a personal digital assistant (PDA), mobile terminal, electronic notebook, etc.

What is claimed is:

1. A circuit board device comprising:
 a circuit board having a first surface and a second surface opposed thereto;
 a first electronic component mounted on the first surface of the circuit board;
 a stud set up on the first surface of the circuit board and fastened to the circuit board by a stud fixing screw threaded therein from the second surface side;
 a heat radiating member which is thermally connected to the first electronic component and radiates heat from the first electronic component;
 a pressing member which is screwed to the stud from the first surface side of the circuit board and presses the heat radiating member against the first electronic component; and
 a second electronic component located on the second surface of the circuit board so as to overlap the stud fixing screw.

2. A circuit board device according to claim 1, wherein the pressing member is formed of a fixing plate having a pressing portion in contact with the heat radiating member and one end portion screwed to the stud.

3. A circuit board device according to claim 2, which further comprises another stud set up on the second surface of the circuit board, and wherein the fixing plate has the other end portion screwed to the another stud through the circuit board from the first surface side of the circuit board.

4. A circuit board device according to claim 3, wherein the heat radiating member has a rectangular radiator plate in surface contact with the first electronic component and opposed to the first surface of the circuit board, and the fixing plate extends in a direction inclined with respect to a side edge of the radiator plate, the one and the other end portions of the fixing plate being provided individually on the opposite sides of the radiator plate with the radiator plate therebetween.

5. An electronic apparatus comprising:
 a case having a bottom wall; and
 a circuit board device located on the bottom wall in the case,
 the circuit board device including a circuit board having a first surface and a second surface opposed thereto, a first electronic component mounted on the first surface of the circuit board, a stud set up on the first surface of the circuit board and fastened to the circuit board by a stud fixing screw threaded therein from the second surface side, a heat radiating member which is thermally connected to the first electronic component and radiates heat from the first electronic component, a pressing member which is screwed to the stud from the first surface side of the circuit board and presses the heat radiating member against the first electronic component, and a second electronic component located on the second surface of the circuit board so as to overlap the stud fixing screw.

* * * * *